United States Patent [19]
Feger et al.

[11] Patent Number: 5,546,655
[45] Date of Patent: Aug. 20, 1996

[54] METHOD OF APPLYING FLEX TAPE PROTECTIVE COATING ONTO A FLEX PRODUCT

[75] Inventors: Claudius Feger, Hopewell Junction; Teresita O. Graham, Irvington; Kurt R. Grebe, Beacon; Alphonso P. Lanzetta, Marlboro; John J. Liutkus, Yorktown Heights; Linda C. Matthew, Peekskill; Michael J. Palmer, Walden; Nelson R. Tanner, Harpursville; Ho-Ming Tong, Yorktown Heights, all of N.Y.; Charles H. Wilson, Beckley, W. Va.; Helen L. Yeh, Katonah, N.Y.

[73] Assignee: International Business Machines Corporation, Armonk, N.Y.

[21] Appl. No.: 329,066

[22] Filed: Oct. 25, 1994

Related U.S. Application Data

[62] Division of Ser. No. 761,182, Sep. 17, 1991, Pat. No. 5,360,946.

[51] Int. Cl.⁶ .................................................. H05K 3/02
[52] U.S. Cl. .................. 29/846; 29/852; 174/254; 205/125; 427/97; 437/220
[58] Field of Search ....................... 205/125; 29/852; 174/254; 427/97; 437/220

[56] References Cited

U.S. PATENT DOCUMENTS

| | | | |
|---|---|---|---|
| 4,179,800 | 12/1979 | Takaba et al. | 205/125 X |
| 4,585,528 | 4/1986 | Matsumoto | 205/125 |
| 4,931,148 | 6/1990 | Kukanskis et al. | 205/125 X |
| 4,983,252 | 1/1991 | Masui et al. | 29/852 X |
| 5,062,204 | 11/1991 | Miller et al. | 174/254 X |
| 5,108,553 | 4/1992 | Foster et al. | 29/852 X |

*Primary Examiner*—Carl J. Arbes
*Attorney, Agent, or Firm*—Thomas A. Beck

[57] ABSTRACT

A flex or TAB product suitable for chip carrier applications wherein the flex reliability problems caused by copper dendrite growth and lead bending during power and thermal cycling are reduced by application of special coatings to lead areas of the flex tape.

25 Claims, 6 Drawing Sheets

METHOD OF APPLYING FLEX TAPE PROTECTIVE COATING ONTO A FLEX PRODUCT

This application is a division of application Ser. No. 07/761,182, filed Sep. 17, 1991, U.S. Pat. No. 5,360,946.

TECHNICAL FIELD

The present invention relates to an improved flex (or TAB) product suitable for silicon carrier or other types of chip carrier applications, wherein the flex reliability problems caused for example by Cu dendrite growth and lead bending during power and thermal cycling are substantially reduced or eliminated. More particularly, the invention embodies a number of coatings for use in such products and diverse methods of making and using same.

In the first embodiment, the entire flex containing openings (or windows) in the substrate comprising polyimide, fabricated by one of the four methods detailed hereinafter, is manufactured in such a way that the coating and substrate are patterned and etched at the same time.

The second embodiment of the invention relates to a liquid or colloidal coating that is applied by, for example, silk screening on the inner/outer lead areas on a flex tape. The properties of the liquid used in combination with the windows in the substrate allow very precise coating with a wide latitude for alignment.

In the third embodiment of the present invention, the flex product, used as the interconnection between carrier and printed circuit board, is coated with a thin layer of low stress material characterized by a low product of modulus and thermal expansion coefficient. The coating prevents lead breaks and electrical shorts between adjacent leads caused by excessive lead bending upon thermal cycling.

In a fourth embodiment of the invention, a thin layer of low stress coating material is applied at the appropriate location on the outer lead area of a flex to seal off the area around each exposed lead with a polymer means.

PRIOR ART

According to a standard flex (or TAB) fabrication process for chip carrier applications, the lead windows in the polyimide film substrate are created after the plating of the metal pattern. This is typically achieved by wet etching the polyimide substrate through a resist window on the polyimide using a caustic etch agent (e.g., aqueous KOH solution). Following formation of the window, a standard practice is to coat the metal pattern with a thin layer of Au. In certain cases, the Au coating meant to protect the metal pattern does not prevent flex reliability problems such as Cu dendrite growth during power-up.

According to the prior art, one method to solve these reliability problems is to spray coat the bulk of the flex over an area between the inner and outer lead area with a high stress coating material such as a filled epoxy (e.g., Scotchcast) before bonding of the inner and outer leads to substrates (e.g., silicon carrier and printed circuit board) with matching metal pads.

One reason that the aforementioned high stress coating cannot be applied directly over the inner/outer lead areas is the difficulty involved in making a metal spray mask covering these areas with fine details, such that during spraying, the liquid coating material does not contaminate the critical bonding areas of these leads.

After bonding, a final coat is then sprayed over the areas containing bonded inner and outer leads.

The flex prepared by the method noted above, however, can suffer from the reliability problems such as Copper (Cu) dendrite growth over the inner/outer lead areas due to incomplete coverage of the flex by the final coat.

Also, during flex coating prior to bonding, damage can be inflicted on the partially supported Cu leads due, for instance, to the contact between flex leads and spray mask as well as other physical fixtures that can be in contact with the flex, which as a result can greatly reduce the yield of the flex coating step.

In addition, the partially supported leads on the flex over the inner/outer lead areas after bonding to the substrates can suffer from severe lead bending during power and thermal cycling, leading eventually to lead breaks and electrical shorts due to the high thermal stresses exerted by the high stress coating.

U.S. Pat. No. 4,209,355 discloses a composite tape product having an insulated layer with an aperture therein and a plurality of conducting leads extending in cantilevered fashion into the aperture.

U.S. Pat. No. 4,681,654 discloses a method for making flexible film substrates in a continuous tape format and describes the use of metallizing and etching polyimide layers to provide circuit patterns on the polyimide layer.

U.S. Pat. No. 4,721,994 discloses a semiconductor device lead frame wherein a dielectric polyimide layer is bonded to the surfaces of the inner leads.

None of these references discloses solutions to the problems associated with the flex coating mentioned in the prior art.

Finally demountable packages in a variety of electronic applications require that one of the connections between the chip and the base to which it is secured, known as the motherboard, be non-permanent, to allow removal and replacement of the package. In the case of a pad-on-pad (POP) module, the outer leads of the flexible connector generally rest on gold pads on the card, held in place by mechanical compression. This situation introduces new concerns about problems at the connection which were previously solved by some kind of permanent fixture or material. For example, the problem of metallic corrosion at the outer lead areas of the flex has been solved in the past by encapsulating these areas after bonding with a permanent polymeric coating. Clearly, some sort of non-permanent alternative must be found for the encapsulating coating, since Corrosion protection is also an issue in the demountable package. The primary function of a coating is to prevent the introduction of contaminants or elements which could damage the part or create a damaging environment. Another way to achieve this would be to surround the sensitive area with a sealant which would keep out contaminants and moisture.

SUMMARY OF THE INVENTION

In accordance with the present invention, the task of protecting the flex from the problems as noted above, including the flex coating yield, Cu dendrite growth, lead breaks and electrical shorts, is achieved by the use of one or more of the embodiments of the present invention.

Following the application of the polymer coating, there are four methods in the first embodiment detailed below that can be used satisfactorily to create the lead window.

The first and preferred method in this embodiment by which the lead windows can be created in the substrate comprises developing the coating and etching the polyimide in a polyimide etchant using the coating as a permanent photoresist.

As a second alternative, the coating and polyimide are etched simultaneously or sequentially using an appropriate polyimide/coating etchant with the help of a resist. Generally in this instance, the coating should be etchable in the polyimide etchant.

As a third option, the coating is first etched using a solvent that does not etch the polyimide with the help of a resist and then the polyimide is etched using a polyimide etchant prior to resist removal. In this instance, the coating preferably should not be etchable in the polyimide etchant.

In the fourth option the coating and the polyimide are ablated using a laser through the use of masks.

The second and third embodiments noted above involve coating the flex after the windows have been created, but before bonding, using a suitable silk screening method with preferably a low stress, filled or unfilled silicone coating. In this instance, the mask can be designed so that the entire flex rather than just the bulk area of the flex away from the inner/outer lead areas is coated, In addition to the properties and/or characteristics mentioned above, the polymer coating material for any of the embodiments mentioned above should preferably possess the following characteristics or properties: (1) good adhesion to the polyimide-metal pattern; (2) good gap-filling properties; (3) relatively thin and flexible so that the flex is drapable during joining; and (4) resistant to subsequent processing and testing conditions.

With respect to the first method in the first embodiment cited above, a polymer is used for the coating. A particularly useful polymer coating is a partially cyclized poly-cis isoprene such as KTFR from Kodak. It contains an average unsaturation of one double bond per 10 carbon atoms which is about 50% of the double bond content of the uncyclized polymer. The double bond may be present in uncyclized $C_5 H_8$ units and/or in six membered rings. A possible structure for the repeating unit is:

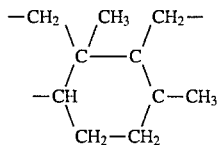

The number average molecular weight of the polymer determined by osmometry is generally about 65,000±5,000. Based on this value, the weight average molecular weight is about 121,700±95,000. A gel permeation chromotographic (GPC) study that has been published relating to this polymer reports a number average molecular weight of 46,000 and a weight average molecular weight of 141,000. A useful sensitizer compound is 2,6-bis (p-azidobenzylidene)-4-methylcyclohexane.

For the second and third methods in the first embodiment, the polymer coatings that can conveniently be used comprise a polyimide film with a suitable adhesive (for example, Thermid from National Starch), a sprayed-on polyimide properly cured on the flex before etching or a partially cured polyimide dry film laminated and cured on the flex.

With respect to the fourth method in the first embodiment relating to ablating the coating and the polyimide using a laser, many polymers are suitable such as epoxies, acrylics and/or the chemical vapor deposited parylene which is not etchable by any solvent.

The low stress silicone coatings preferred in the second and third embodiments noted above include addition-cured based polymers such as SC-3613 (Emerson-Cuming), or JCR-6125 (Toray), optionally containing a non-electrically conductive filler, such as $TiO_2$, or other similar materials.

BRIEF DESCRIPTION OF THE DRAWINGS

FIG. 10 A. is a cross sectional magnified view of the pad-on-pad connection between the upper lead and the motherboard depicted in FIG. 10, with the coating in place.

DETAILED DESCRIPTION OF THE PREFERRED EMBODIMENTS OF THE INVENTION

Figure 1:
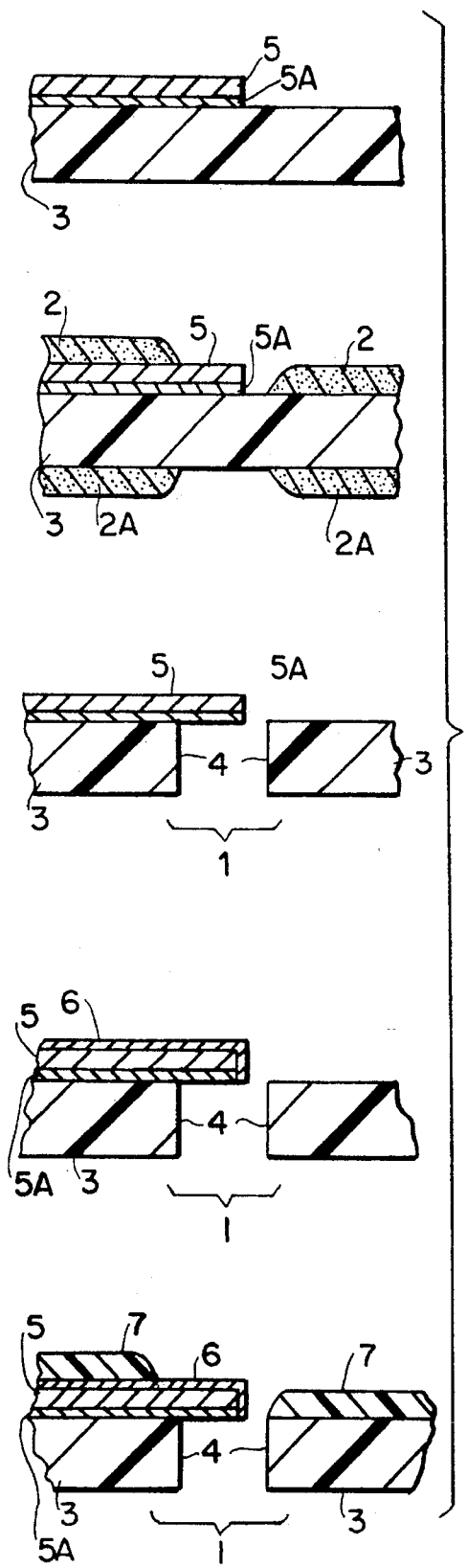
FIG. 1 is a block diagram showing a typical sequence of steps to create a coated flex containing windows.
Figure 2:
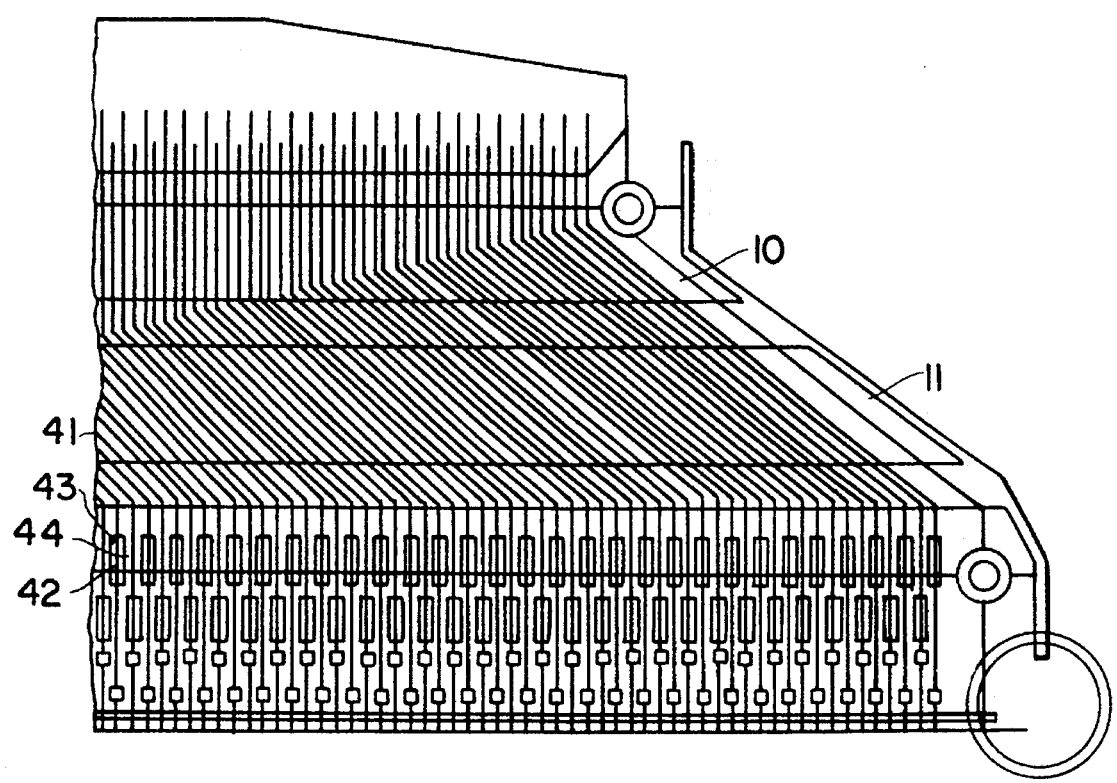
FIG. 2 is an enlarged top view of a flex design utilized in the second embodiment found in the present invention.

Referring to FIG. 1, the standard method to create a coated flex with window 1 is to apply a resist 2, pattern and develop it, and then wet etch the polyimide 3 through the resist using a caustic agent. Following the creation of the window 4, the metal pattern 5 secured to polyimide substrate 3 via a seed layer 5A used to promote adhesion is plated with a thin layer of gold 6. A protective coating 7 is then applied to the bulk of the flex away from the inner/outer lead areas. With respect to the flex utilized in the three embodiments of the present invention, the bulk of the flex is defined as the two bands 10, 11 shown in FIG. 2.

In the first embodiment of the present invention there are four separate methods that can be utilized to obtain a self aligned protective coating over gold plated copper lines during flex fabrication.

Figure 3:
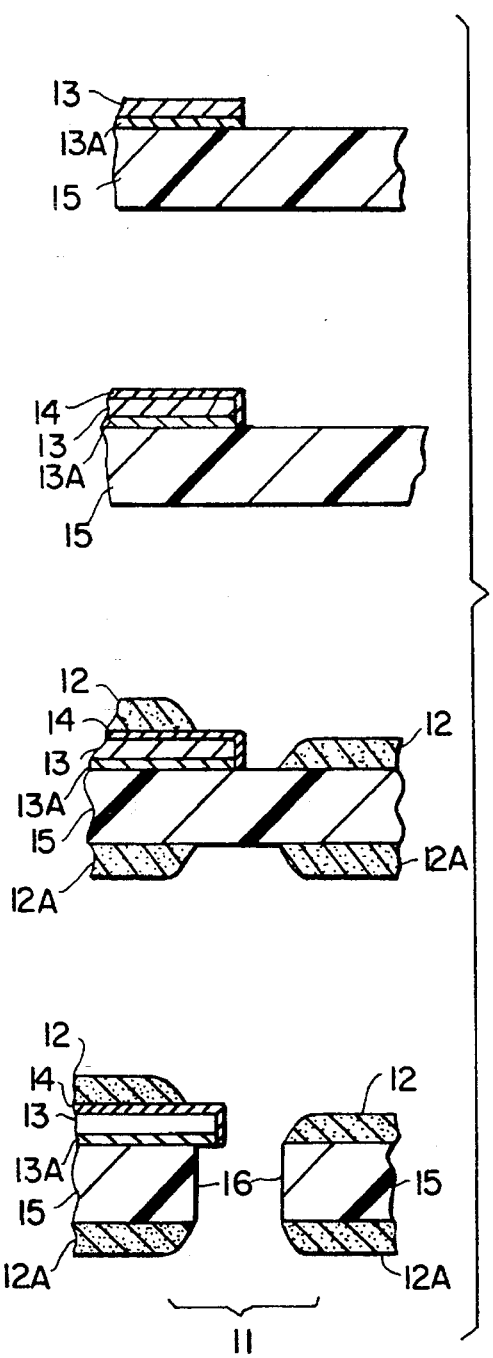
FIG. 3 is a block diagram showing a typical sequence of steps to illustrate the first method in the first embodiment pursuant to the present invention to create a coated flex with windows.

In FIG. 3, which comprises the first method of the first embodiment, the permanent photoresist 12 appearing as the coating on the final flex product 11 can be a poly-cis isoprene as described above or a photoimageable polyimide.

Figure 4:
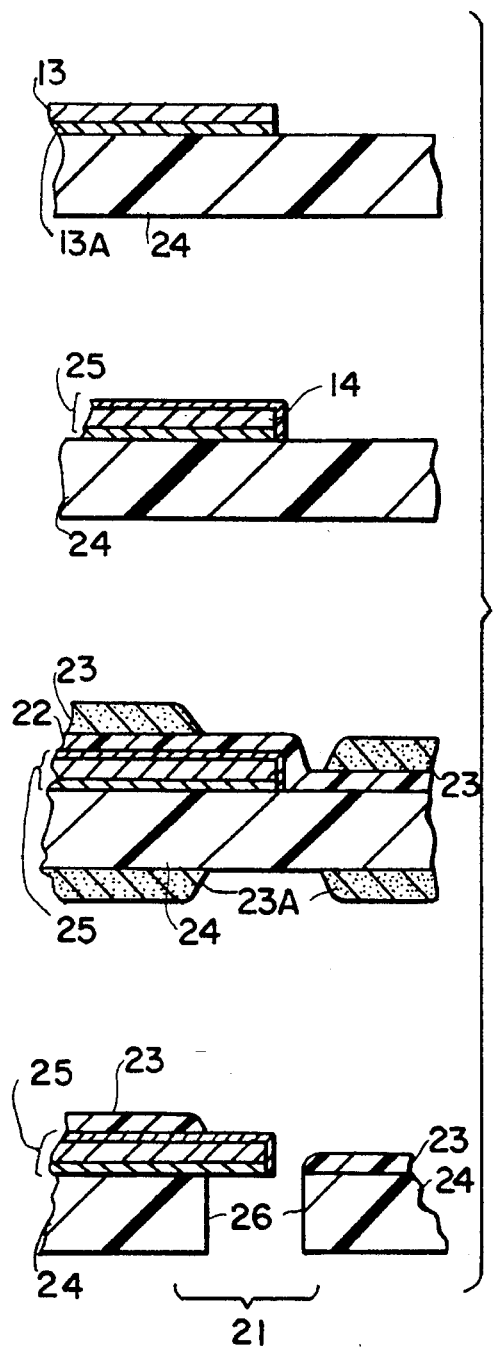
FIG. 4 is a block diagram showing a typical sequence of steps to illustrate the second and third methods in the first embodiment pursuant to the present invention to create a coated flex with windows.

The steps involved in the first self-aligned method comprise first applying the resist 12 on both sides after plating a gold layer 14 on the copper lead 13 which is secured to the polyimide substrate 15 optionally via a seed layer 13A of e.g. Chromium. Any convenient means to secure the lead to substrate can be used. Then the resist is exposed on both sides, developed and the polyimide 15 is etched to create window 16. After the creation of the windows, the resist can be further exposed and cured for enhanced stability. Methods two and three of the first embodiment which give rise to the final flex product 21 as depicted in FIG. 4, comprise applying a non-imageable coating 22 on one side, and applying and patterning a resist 23 on both sides. In accordance with the second method, both the coating 22 and the polyimide 24 are etched using a polyimide etchant: or in accordance with the third method, the coating 22 is etched first using a solvent that does not etch the polyimide 24, and then the polyimide 24 etched with the help of the resist 23. The resist 23 is then stripped. Irrespective of the method used, window 26 is formed by the etching.

A gold plated copper line 25 comprising copper line 13 chromium seed layer 13A and gold plating 14 is depicted in FIG. 4. Also, a similar gold plated line 35 comprising copper line 13, chromium seed layer 13A and gold plated 14 is depicted in FIG. 5.

Figure 5:
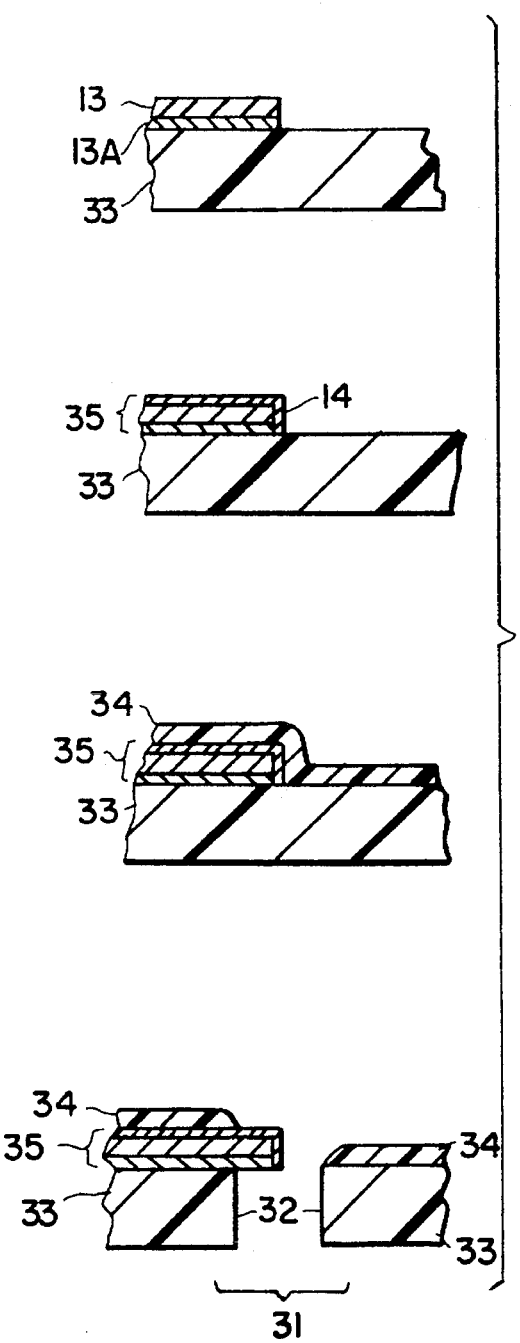
FIG. 5 is a block diagram showing a typical sequence of steps to create pursuant to the fourth method in the first embodiment pursuant to the present invention to create a coated flex with windows.

The fourth method for the fabrication of the coated flex 31 depicted in FIG. 5 comprises forming window 32 in the coated flex by laser ablation. The lead window 32 in the polyimide film 33 are then formed by ablating the coating 34 and the polyimide substrate 33 using a laser.

With respect to the application of a corrosion prevention coating to the outer/inner lead areas on a flex tape according to the second embodiment of the present invention, in some instances it has been determined that silk screening can easily achieve the resolution necessary for one-step coating and the process window is very wide due to surface tension effects associated with certain liquid coating materials at a desired acceptable viscosity at the edge of the window. In a typical flex 41 depicted in FIG. 2, each outer lead 42 for bonding is framed in a polyimide window 43 with very narrow polyimide strip 44 between them, and each inner lead 45 or 45A flanked by one or two adjacent inner leads.

Figure 6:
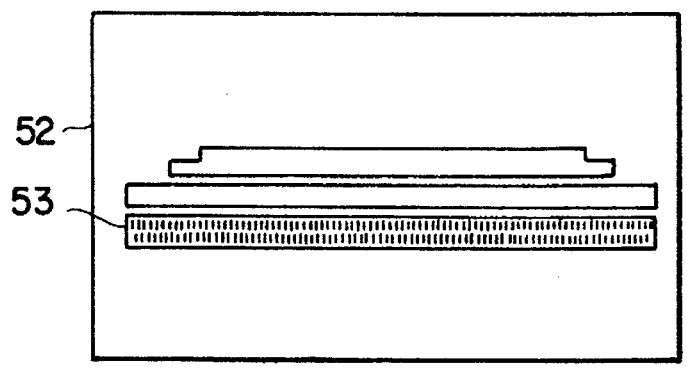
FIG. 6 is a top view of the screening mask used in the second embodiment in accordance with the present invention to create a flex with coated inner and outer lead areas.
Figure 7:
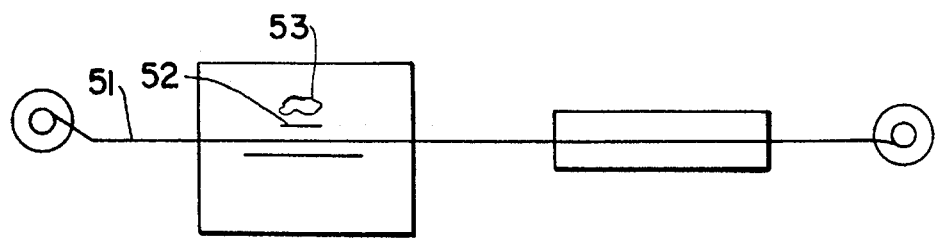
FIG. 7 discloses a silk screening process used in the second and third embodiments of the present invention to coat a thin layer of low stress coating material onto a flex.
Figure 8:
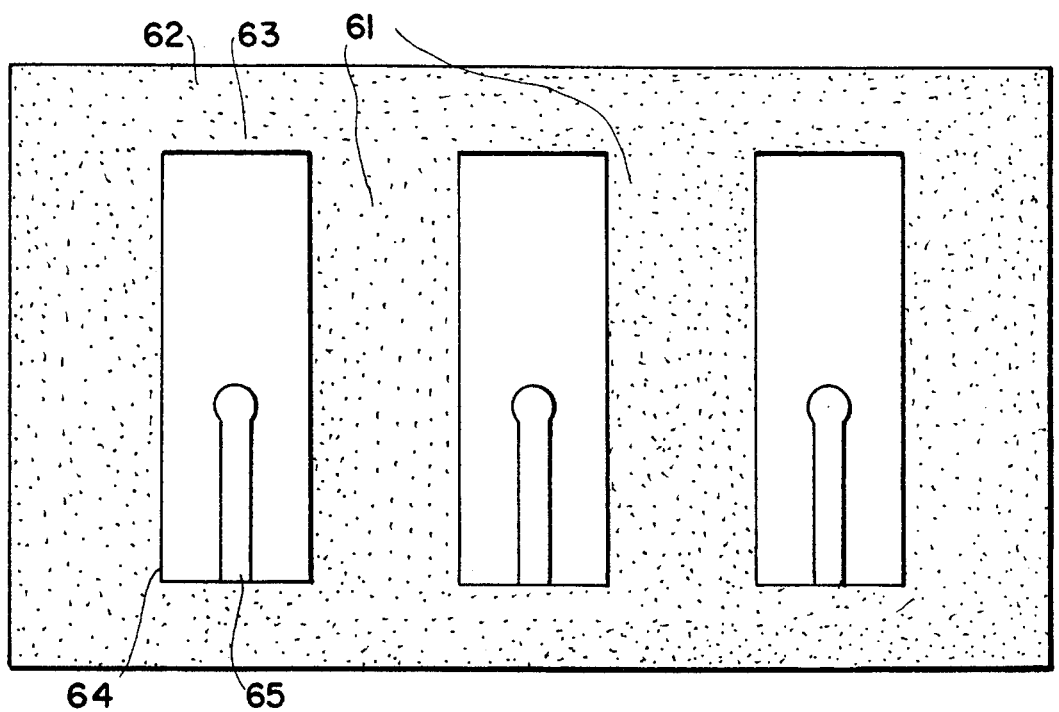
FIG. 8 is a top view of the coated outer lead area showing the coating on the polyimide substrate.

Referring to FIGS. 6, 7 and 8, as shown in FIG. 7, the flex 51 is screened with a stencil 52 (as depicted in FIG. 6) and the coating material 53 is applied to the strips between the windows 63 through an opening 54 having a dimension smaller than the dimension of the polyimide strips between the windows depicted in FIG. 8 at 61. The coating material 62 flows to the edge 64 of the window 63, then forms a smooth rounded edge due to surface tension phenomenon. The result is an even coating 62 on the strip 61 with no material in the window 63 or on both the inner leads (not shown) and outer leads 65. It has been determined that due to the surface tension effect, the process is extremely forgiving with large tolerances on both the stencil 52 alignment and the quantity of material dispensed.

In the third embodiment described above, the flex is coated with a thin layer of low stress material characterized by a low product of modulus and thermal expansion coefficient. This property enables the presence of the flex coating to impact minimally on the lead bending that occurs during power or thermal cycling. In addition to the mechanical property requirement above, this coating material must also exhibit reasonably good adhesion to polyimide and to the gold plating on the copper lines of the flex. Good adhesion in this instance is needed to prevent copper dendrite growth which may occur in the event of coating delamination during the operational life of the flex or stress testing. If screening (e.g., silk screening) such as that shown in FIG. 7 is the method of choice to apply the coating, it is highly desirable for the uncured coating material to have a sufficiently long working pot life (several days) at room temperature to avoid contamination of the coater, etc.

Examples of the flex coatings which have proved effective include silicone based polymers such as SC-3613 (from Emerson and Cuming) or JCR-6215 (from Toray) filled with $TiO_2$ particles. The addition of fillers is necessitated by the need to substantially increase the viscosity of the uncured coating during screening. Other suitable coatings include (1) un-filled silicones with sufficiently high viscosities, and (2) other families of polymers exhibiting comparable properties.

The product which is formed as a result of the use of any of the three embodiments described above, generally possesses copper leads having a thickness of below 125µ, preferably 40µ, a polyimide substrate having a thickness of between 12µ and 125µ preferably 50µ, a gold thickness of between about 0.25µ and 1.2µ, preferably 0.7µ, and a resist-coating thickness generally less than 125µ preferably less than 50µ.

In a typical flex on a dielectric substrate, the substrate may conveniently be formed from a polyimide material. This material has the inherent disadvantage that it can absorb up to 4% of its weight in water usually from the moisture in the air. When conducting leads are positioned on the dielectric substrate mentioned above and are held at different potentials, the moisture serves to enhance an electrochemical reaction wherein dissolution of one of the metal leads occurs accompanied by migration of the metal ions via the moisture medium to the other lead. This reaction ultimately forms dendrites that short out the leads and thus the system.

In accordance with the present invention, in a flex system where there are adjacent leads at different potentials positioned on the surface of a dielectric polymer substrate, the formation of dendrites is prevented by disposing means between said leads that prevent the formation of dendrites.

A preferred means that prevents the formation of dendrites in the aforementioned system is a low modulus polymer such as silicone SC 3613 as described hereinbefore.

More particularly, as noted above, when employing demountable package flexes, sealing the outer lead area against dendritic corrosion is a concern in that the metal pad surface must be exposed to make electrical contact, and no permanent encapsulation after placement is possible.

Figure 9:
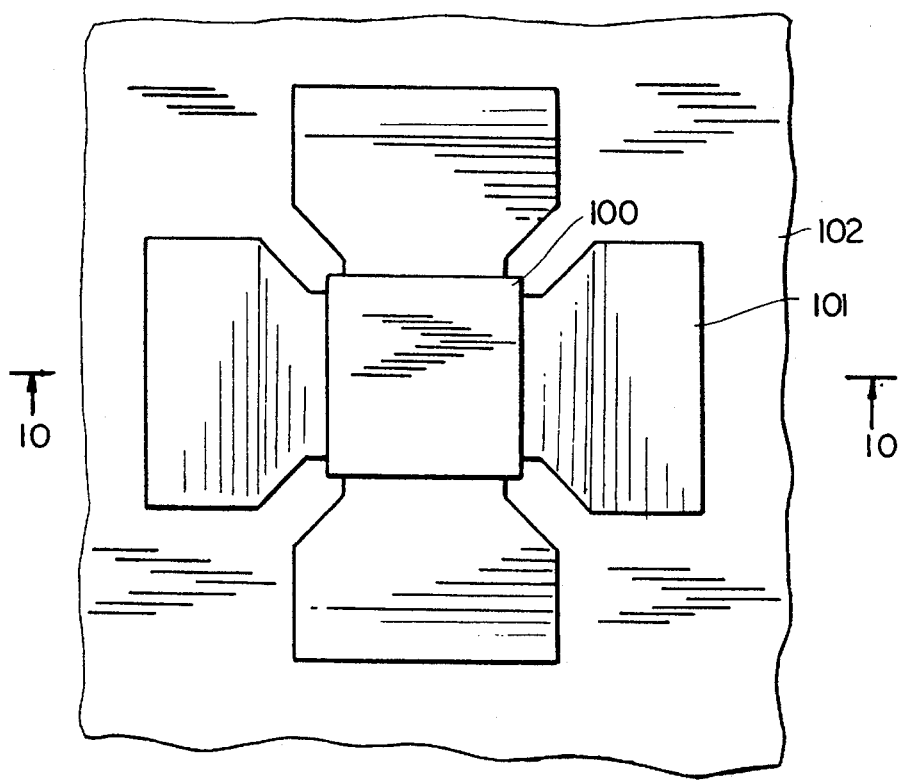
FIG. 9. depicts a top view of the fourth embodiment and is an overall perspective view of the relationship of chip, the card and the leads.

The present invention provides a coating design to prevent corrosion at the outer lead area of a pad-on-pad flex. Since the main body of the flex between the inner and outer leads remains unchanged, the current coating design would be used for coating that particular section of the flex tape. FIG. 9 depicts a top view of the system showing chip 100, flex 101 and motherboard (card) 102. In this view, since the demountable package is assembled "copper lead down", no lines are shown as they are covered.

Figure 10:
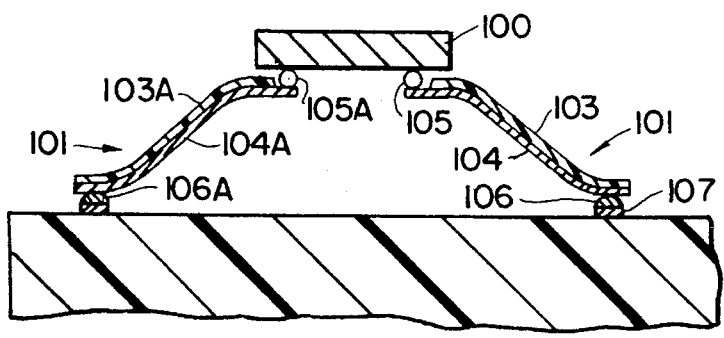
FIG. 10. is a cross sectional view of the demountable package described in the fourth embodiment.

FIG. 10 depicts a cross sectional view of the system depicted in FIG. 9.

FIG. 10 shows the motherboard 102, the flex 101 and chip 100. A dielectric material such as kapton 103 and 103A cover copper leads 104 and 104A. The copper leads 104 and 104A are connected to chip 100 at sites 105 and 105A and to the motherboard at sites 106 and 106A.

Figure 10A:
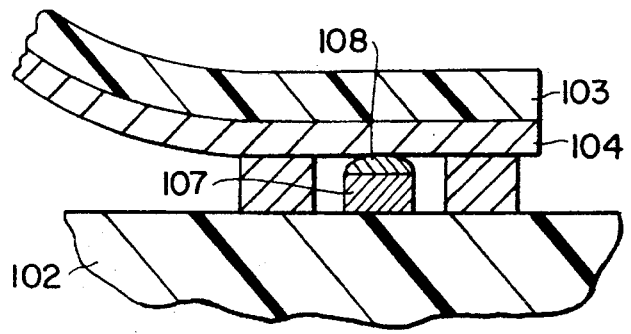

FIG. 10A provides a close-up of the connection of (gold-coated) copper lead 104 to a copper pad 107 on the motherboard 102 through lead-tin connection 108.

Figure 11:
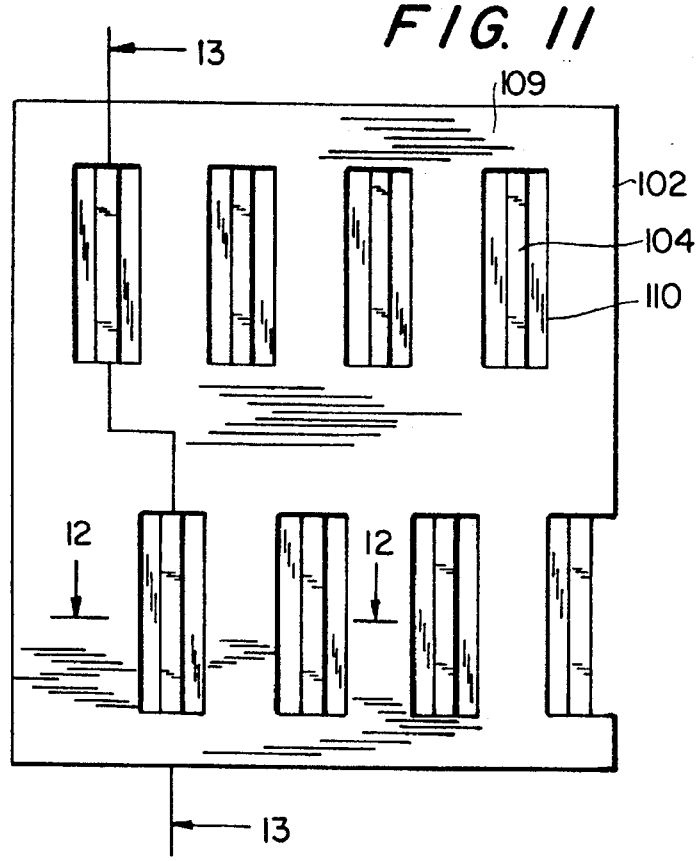
FIG. 11 is a top view of the outer lead area with sealant in place.

FIG. 11 is a top view of the fourth embodiment of the invention and the rectangular outlines around the exposed metal lead 104. When the flex 101 is mounted and compressed, the sealant 109 rectangles are forced against the surface of the motherboard 102. Thus, a small, hermetically sealed area is formed around each exposed metal lead. Implicit in this design depicted is the assumption that the flex is used copper-down, and that there are no holes in the polyimide substrate inside the outline of the sealant rectangle.

Figure 12:
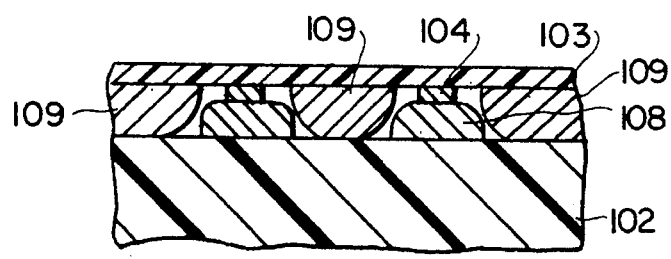
FIG. 12 is a cross sectional view of the outer lead area with sealant along 12—12 of FIG. 11.

FIG. 12 depicts is a cross sectional view of the system along axis 12–12 of FIG. 11 showing the dielectric material such as Kapton 103, copper lead 104, pop connection 108, sealant 109 and motherboard 102.

Figure 13:
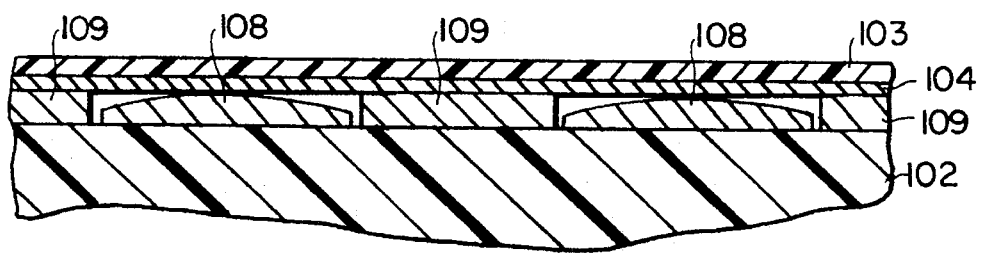
FIG. 13 is a cross sectional view of the outer lead area with sealant along 13—13 of FIG. 11.

FIG. 13 depicts a cross sectional view of the system along axis 13—13 of FIG. 11 showing motherboard 102, motherboard pads 108, copper lead 104, sealant 109 and a dielectric sheet 103 such as kapton.

In practical use, the sealant rectangles of polymer coating can be screened onto the flex at the same time that the rest of the coating is applied, so that no extra steps or new processes are required. The sealant rectangles are fully compatible with the concept of a demounted connection, and are implemented by the same mechanical compression used to fix the flex. The sealant rectangles serve a double function: they prevent the gross introduction of contaminants, and, if well adhered, prevent the migration of dissolved metal between adjacent leads. This invention can be extended to any application where an environmental seal is necessary and a direct coating cannot be used.

An alternative includes an encapsulating coating which could be dissolved prior to demounting, but care must be taken so that the rest of the package is not contaminated. This particular alternative method would be less efficient in field replacement applications. Any processes of this sort in replacing a module using a solvent would have to be conducted in a more controlled manner.

It is to be understood that the methods described are not limited to copper conductors and polyimide based layers. Other conductors such as aluminum and other base layer materials such as Upilex-S and BPDA-PDA polyimide can also be used effectively.

EXAMPLE

Using the first embodiment of the first method described above, a flex having copper lines of a thickness of 50µ are adhered to a polyimide substrate of approximately 50µ through a Chromium containing intermediate seed layer. The article was spray coated with KTFR, resist baked at 10 minutes at 90° C., exposed at 100 mJ/Cm$_2$, and developed in a KOH based polyimide etchant.

Coated flexes were also fabricated using the low stress SC-3613 silicone material described in the third embodiment, as well as the screening process described in the second embodiment.

These flexes (containing the KTFR and silicone coatings) were subjected to the inner lead bending test performed between 40° and 125° C. as well as other tests devices to determine the adhesion of the coating to the flex (pressure cooker test), and the ability of the coating to prevent Cu dendrite growth (temperature/humidity/bias test at 80° C./80/15 V for 350 hours), and no dendritic growth was observed or measured electrically.

Having thus described our invention, what we claim is new, and desire to secure by Letters Patent is:

1. A method for making a flex product comprising: in a metal lead having a top surface and a bottom surface, securing said bottom surface of said metal lead to a substrate, plating a protective metal coating on said top surface of said metal lead, applying a photoresist coating on said protective metal coating, placing a pattern on said photoresist coating, exposing said pattern and developing said pattern to result in selected open areas in said photoresist coating, and contacting said open areas with an etchant to form openings through said substrate.

2. The method defined in claim 1 wherein said coating is a photoimageable polymer resistant to the substrate etchant.

3. The method defined in claim 1 wherein said substrate is polyimide.

4. The method defined in claim 3 wherein said metal lead is copper.

5. The method defined in claim 4 wherein a chromium containing seed layer is positioned between said metal lead and said substrate.

6. The method defined in claim 3 wherein said resist is a partially cyclized poly-cis isoprene containing an average unsaturation of one double bond per 10 carbon atoms.

7. A method for making a flex product comprising: securing a metal lead to a substrate, plating a protective metal coating on the exposed areas of said metal lead, applying a non-imageable coating on the side of the substrate where said leads are located applying a resist on both sides of said substrate, patterning and developing said resist, etching said dielectric coating and said substrate simultaneously to form an opening therethrough and stripping said resist.

8. The method defined in claim 7 wherein said metal lead is copper.

9. The method defined in claim 8 wherein a chromium containing seed layer is positioned between said metal lead and said substrate.

10. A method for making a flex product comprising: securing a metal lead to a substrate, plating a protective metal coating on the exposed areas of said metal lead, applying a non-imageable coating on the side of the substrate where said leads are located applying a resist on both sides of said substrate, patterning and developing said resist, etching said dielectric coating with a solvent that does not etch said substrate, then etching said substrate with a solvent suitable to form an opening therethrough and stripping the resist.

11. The method defined in claim 10 wherein said metal lead is copper.

12. The method defined in claim 11 wherein a chromium containing seed layer is positioned between said metal lead and said substrate.

13. A method for making a flex product comprising: securing a metal lead to a substrate, plating a protective metal coating on the exposed areas of said metal lead, applying a dielectric coating over said metal coated metal lead, and forming an opening through said substrate and said dielectric coating by ablating selected areas with a laser beam.

14. The method defined in claim 13 wherein said metal lead is copper.

15. The method defined in claim 14 wherein a chromium containing seed layer is positioned between said metal lead and said substrate.

16. A method of applying a coating to a flex product structure comprising a substrate having first and second edges and containing at least one window therethrough and having at least one metal coated metal lead thereon aligned with said window, said metal coated lead extending on said substrate from an inner lead area on said first edge thereof, to an outer lead area at said edge, said lead at said inner-outer lead area extending in cantilevered fashion over said window in said substrate; a dielectric coating disposed on at least one side of said flex product structure, said dielectric coating being self-aligned to the edges of said window, comprising the steps of: preparing a silk screen stencil having the general configuration of a flex product structure and having openings corresponding to areas to said flex to which a coating material is to be applied; aligning said stencil over said flex product structure; screening said suitable coating material through said openings in said screen on to said flex and curing said coating.

17. The method defined in claim 16 wherein said coating material is a polymer having a viscosity between about 20,000 and 30,000 cp.

18. The method defined in claim 17 wherein said coating material is a silicone having a viscosity between about 20,000 and 30,000 cp.

19. The method defined in claim 17 wherein a coating is dispensed on all portions of said flex product structure supported by said substrate.

20. The method defined in claim 16 wherein said coating has a sufficient viscosity so that it is capable of flowing along the surface of said flex product structure and terminating its flow at the edge of said window.

21. The method defined in claim 16 wherein the openings in said silk screen are slightly narrower than the corresponding regions to be coated on said flex product structure to allow for flow of said coating.

22. The method defined in claim 17 wherein the difference between said openings and said corresponding regions is between about 20µ and 50µ.

23. The method defined in claim 17 wherein said coating material is a low viscosity polymer.

24. The method defined in claim 23 wherein said low viscosity polymer contains a particulate filler in admixture therewith.

25. The method defined in claim 24 wherein said low viscosity polymer is a silicone containing a particulate filler to increase viscosity to the desired range.

* * * * *